(12) United States Patent
Chen

(10) Patent No.: US 7,168,021 B2
(45) Date of Patent: Jan. 23, 2007

(54) BUILT-IN TEST CIRCUIT FOR AN INTEGRATED CIRCUIT DEVICE

(75) Inventor: Ker-Min Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 114 days.

(21) Appl. No.: 10/906,047

(22) Filed: Feb. 1, 2005

(65) Prior Publication Data
US 2006/0174173 A1    Aug. 3, 2006

(51) Int. Cl.
G01R 31/28    (2006.01)
(52) U.S. Cl. .......................... 714/733; 714/738; 714/30
(58) Field of Classification Search ............... None
See application file for complete search history.

(56) References Cited

U.S. PATENT DOCUMENTS

| | | | | |
|---|---|---|---|---|
| 4,720,672 A | | 1/1988 | Turino | |
| 4,977,579 A | * | 12/1990 | Bateman | ..................... 375/224 |
| 5,621,729 A | * | 4/1997 | Johnson et al. | ............. 370/259 |
| 5,621,739 A | * | 4/1997 | Sine et al. | ................... 714/724 |
| 5,815,511 A | * | 9/1998 | Yamamoto | ................... 714/733 |
| 5,968,191 A | | 10/1999 | Thatcher et al. | |
| 6,000,051 A | | 12/1999 | Nadeau-Dostie et al. | |
| 6,477,674 B1 | * | 11/2002 | Bates et al. | ................. 714/738 |
| 6,563,353 B1 | | 5/2003 | Chen et al. | |
| 2003/0070126 A1 | * | 4/2003 | Werner et al. | ............... 714/715 |

* cited by examiner

Primary Examiner—Guy Lamarre
Assistant Examiner—John P. Trimmings
(74) Attorney, Agent, or Firm—Baker & McKenzie LLP

(57) ABSTRACT

An integrated circuit device can be tested using a built-in test circuit, in the IC device, that tests the operation of an I/O cell. The built-in test circuit includes a pattern generator for generating a series of simulation signals. The built-in test circuit successively stores and retrieves the simulation signals from an I/O buffer of the I/O cell. For each iteration of storing and retrieving, test logic of the built-in test circuit compares the stored and retrieved data to check whether the data matches. If a mismatch is detected, the test logic issues a fail signal. The fail signal can cause a unique signal at the pad of the I/O cell that alerts a tester to the failure of the IC device. The fail signal can also cause the issuance of a device failure signal that can be detected at other pins of the IC device.

18 Claims, 6 Drawing Sheets

BUILT-IN TEST CIRCUIT FOR AN INTEGRATED CIRCUIT DEVICE

TECHNICAL FIELD

This disclosure relates to built-in test circuits for testing integrated circuits.

BACKGROUND

Past methods of I/O testing include loop testing and boundary scan testing. Loop testing involves testing I/O cells in pairs, including an input cell and a corresponding output cell. A signal is input to the pad of an input cell and then sampled at the pad of the output cell. The output signal is compared to the input signal to determine whether the pair of I/O cells are functioning properly. This method is not suitable, however, for general, bidirectional I/O cells.

For more general applications, the boundary scan method is often used. An example of boundary scan testing is disclosed in IEEE 1149.1, which is a standard developed by JTAG (Joint Test Action Group). The boundary scan method requires a device have a boundary scan cell for each of its input and output ports. The boundary scan cells are serially connected to form a shift register around the boundary of the device. Test data, such as test I/O data, is passed into and out of the boundary shift register serially using dedicated test pins. Since testing a device using the boundary scan method requires data to be shifted serially around the shift register, such test procedures can be rather time consuming.

SUMMARY

The present disclosure presents a built-in self test (BIST) circuit for each I/O cell of an integrated circuit device. Each I/O cell's BIST circuit includes a pattern generator for generating simulation data for testing the I/O cell. The BIST circuit can be connected between the core logic of an integrated circuit device and an I/O cell. When not in test mode, the BIST circuit can relay data between the I/O cell and the core logic. When activated, the BIST circuit can send and receive a simulation signal composed of a succession of varying data values to the I/O cell. The succession of data values can include, for example, a plurality of multi-bit data values that are repeated. Test logic of the BIST circuit can compare the data that was stored in the I/O cell to data retrieved from the I/O cell, thereby determining whether the I/O cell is functioning properly. If a failure is detected, the test circuit can issue a fail signal. In some embodiments, the fail signal can be detected external to the integrated circuit device at the pad associated with the I/O cell that has failed. In some embodiments, an integrated circuit device can include a BIST circuit for each I/O cell, and a device failure detector can be used to sense a fail signal from any of the BIST circuits and, in response, issue a device fail signal that can be detected external to the integrated circuit device.

BRIEF DESCRIPTION OF THE DRAWINGS

Embodiments are illustrated by way of example in the accompanying figures, in which like reference numbers indicate similar parts, and in which.

DETAILED DESCRIPTION

Figure 1:
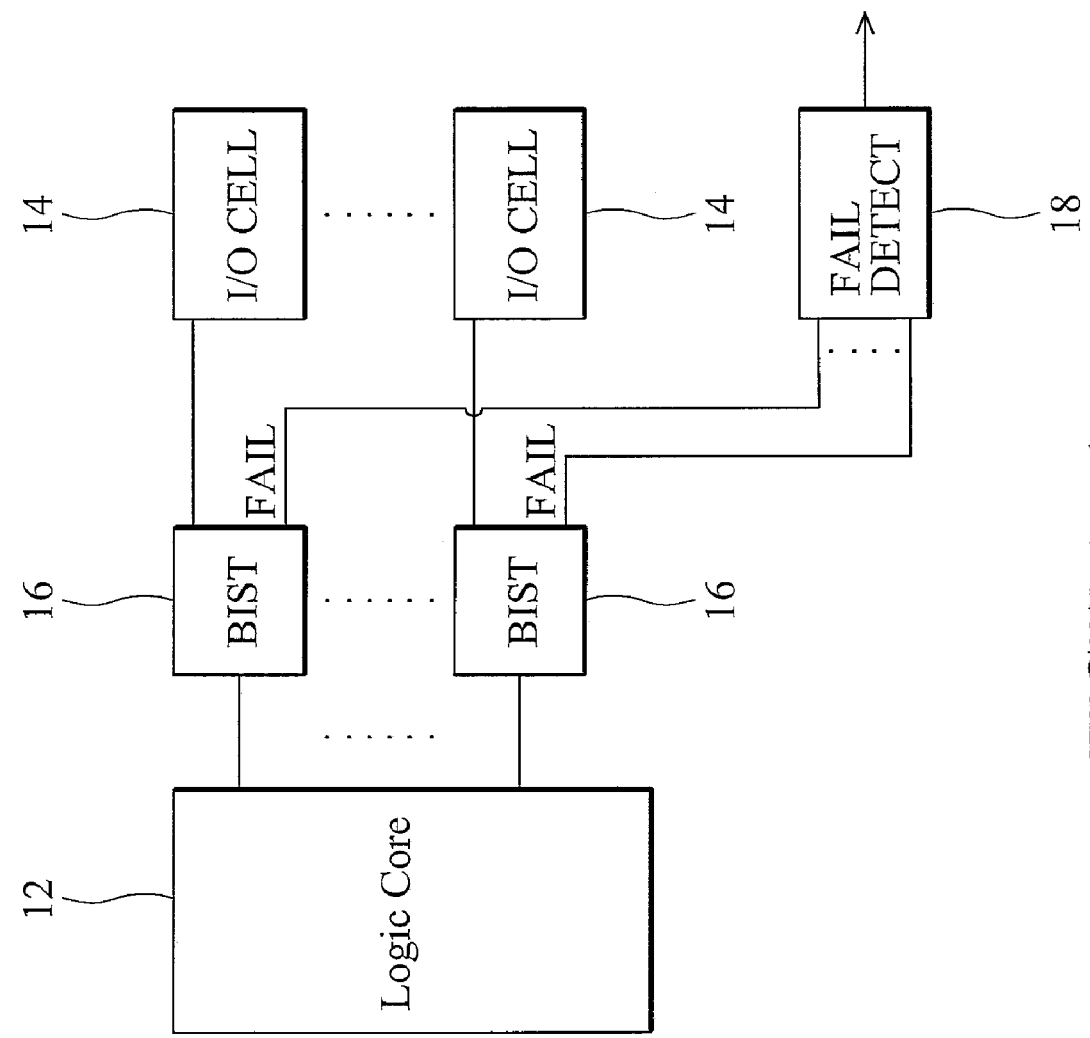
FIG. 1 shows a block diagram of a logic device having multiple I/O cells and built-in test circuits.

FIG. 1 shows a block diagram of an integrated circuit device 10. The integrated circuit device 10 includes a logic core 12 and a plurality of I/O cells 14. The logic core 12 can comprise core logic circuitry including digital and/or analog components. A plurality of built-in test circuits (BIST) 16 are provided for testing the I/O cells 14. Optionally, additional circuitry can be provided for collectively reporting results of the BIST circuits 16. In the embodiment shown in FIG. 1, a FAIL flag signal from any of the BIST circuits 16 can be received by a fail detect circuit 18. For example, the fail detect circuit 18 can include an OR gate that will output a device failure signal if any FAIL flag signal is received. In some embodiments, the integrated circuit device can have one or more specific pins (not shown) that are designated for issuance of the failure signal. The integrated circuit device 10 can also include one or more specific pins (not shown) for receiving a signal to commence and/or halt the testing performed by the BIST circuits 16.

Figure 2:
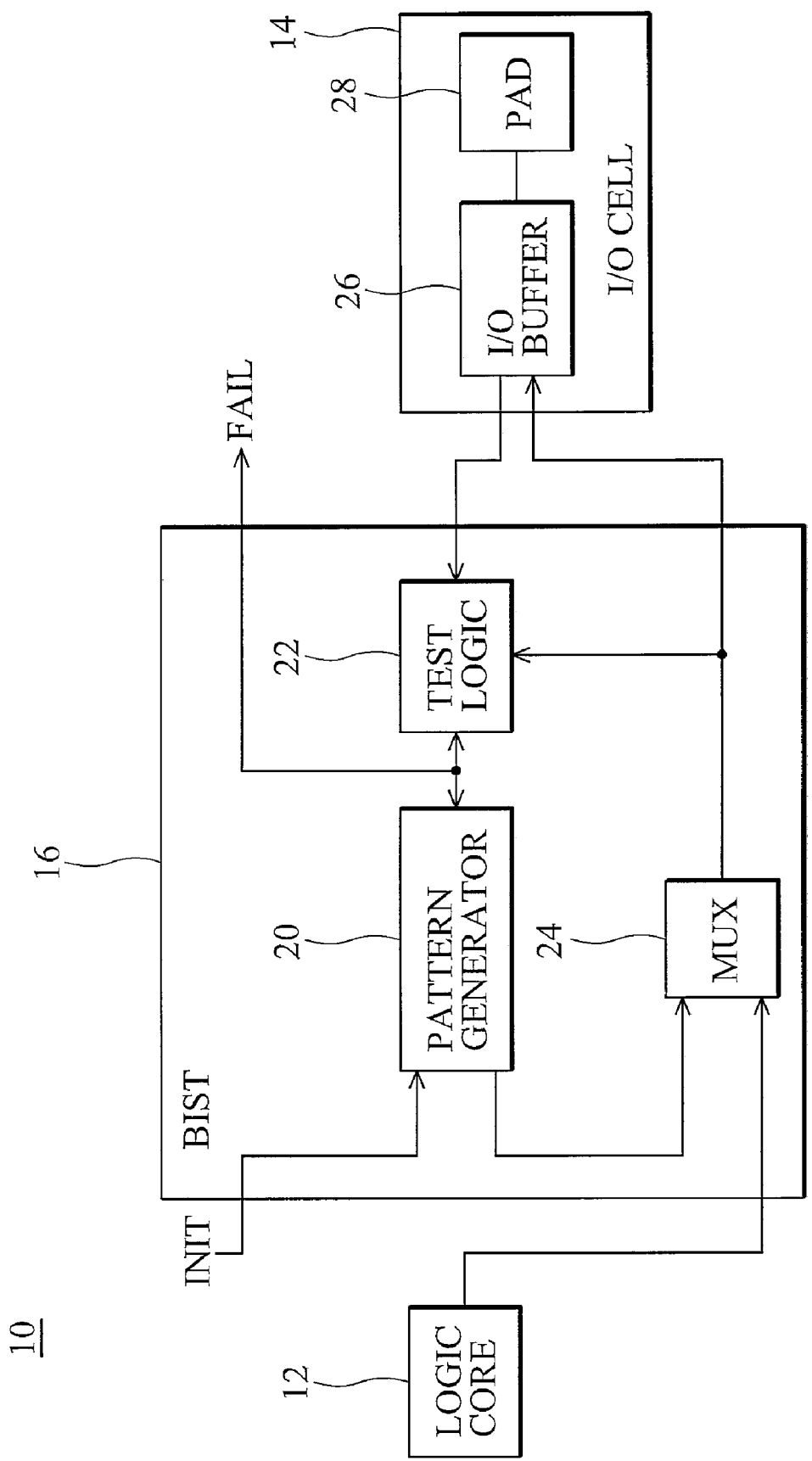
FIG. 2 shows a block diagram of a built-in test circuit and an associated I/O cell.

FIG. 2 shows a more detailed block diagram of a portion of the integrated circuit device 10. Alternately, FIG. 2 can be considered to show an embodiment of an integrated circuit device 10 having only a single I/O cell 14. The BIST circuit 16 includes a pattern generator 20, test logic 22, and a multiplexer circuit (mux) 24. During normal operation (e.g., when not in test mode), the multiplexer circuit 24 passes data from the logic core 12 to the I/O cell 14.

The BIST circuit 16 can be activated for testing the I/O cell 14 by setting the INIT flag. The INIT flag can be set by a signal received external to the integrated circuit device 10 or it can be set by the logic core 12. When the INIT flag is set, the pattern generator 20 generates a simulation signal that simulates typical data that could be generated by the logic core 12. The multiplexer circuit 24 passes the simulation signal from the pattern generator 20 to the I/O cell 14.

The I/O cell 14 can be a bidirectional I/O cell having an I/O buffer 26 and a pad 28. The I/O buffer 26 successively receives and stores data of the simulation signal received from the multiplexer circuit 22. The data of the simulation signal is also provided to the test logic 22. For each iteration of receiving and storing performed by the I/O buffer 26, the test logic 22 samples the data stored in the I/O buffer 26 and compares it to the data of the simulation signal it received from the multiplexer circuit 24. Based on this comparison, the test logic 22 can determine whether the I/O cell 14 is operating properly.

If the test logic 22 detects a failure in the I/O cell 14, a FAIL signal is reported. In some embodiments, this can include setting a FAIL flag. For example, in the embodiment shown in FIG. 1, the FAIL flag could be set and detected by the fail detect circuit 18. In some embodiments, the test logic 22 submits a fail signal to the pattern generator, which in turn alters the signals it is generating from the simulation signal to a fail signal. The fail signal is then passed through the multiplexer circuit to the I/O cell 14 where it can be detected at the pad 28.

Figure 3:
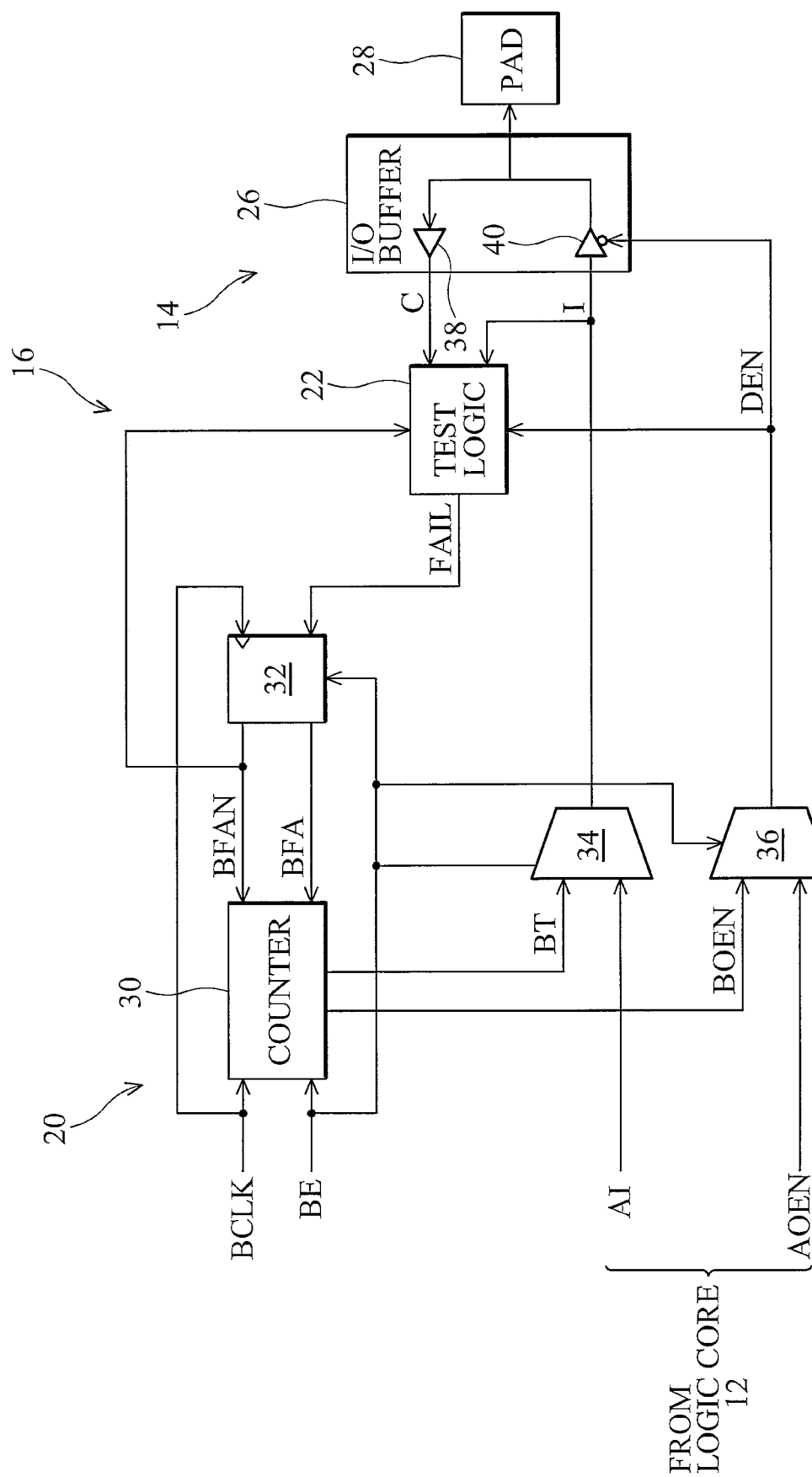
FIG. 3 shows a block diagram of an embodiment of the built-in test circuit and I/O cell shown in FIG. 2.

FIG. 3 shows a more detailed view of the BIST circuit 16. The pattern generator 20 includes a counter circuit 30 and a register 32. The multiplexer circuit 24 includes a first multiplexer 34 and a second multiplexer 36. The I/O buffer 26 is a bidirectional I/O cell that includes an input driver 38 and an output driver 40.

The multiplexer circuits 34 and 36 control whether data from the logic core 12 or the simulation signal from the pattern generator 20 is passed to the I/O cell 14. The signal BE, which serves as the test INIT signal shown in FIG. 2, controls the operation of the multiplexer circuits 34 and 36. In the embodiment shown, when the signal BE is high, the multiplexers 34 and 36 pass the signals BI and BOEN from the pattern generator 20 and block the signals AI and AOEN from the logic core 12. Otherwise, if the signal BE is low, the signals BI and BOEN are blocked while the signals AI and AOEN are passed.

When the signal BE transitions high, it initiates operation of the counter circuit 30. The counter circuit 30 is an n-bit counter circuit that repeatedly sequences through outputting $2^n$ different data values that are sent to the I/O buffer 26. This sequence of data values is repeated while the counter circuit 30 is operating and no failure is detected. This repeated succession of data values constitutes an embodiment of the simulation signal. Other simulation signals can be used.

The simulation signal is intended to simulate a variety of data values that could be generated by the logic core 12. For example, in the architecture shown in FIG. 3, the logic core 12 provides two bits of data: AI and AOEN. Thus, the counter circuit 30 is a 2-bit counter whose output repeatedly sequences through the $2^2$ different variations of AI and AOEN. Specifically, since the data that can be produced by the combination of AI and AOEN include (0,0), (0,1), (1,0), and (1,1), the counter circuit 30 repeatedly sequences through these combinations of AI and AOEN.

Figure 4:
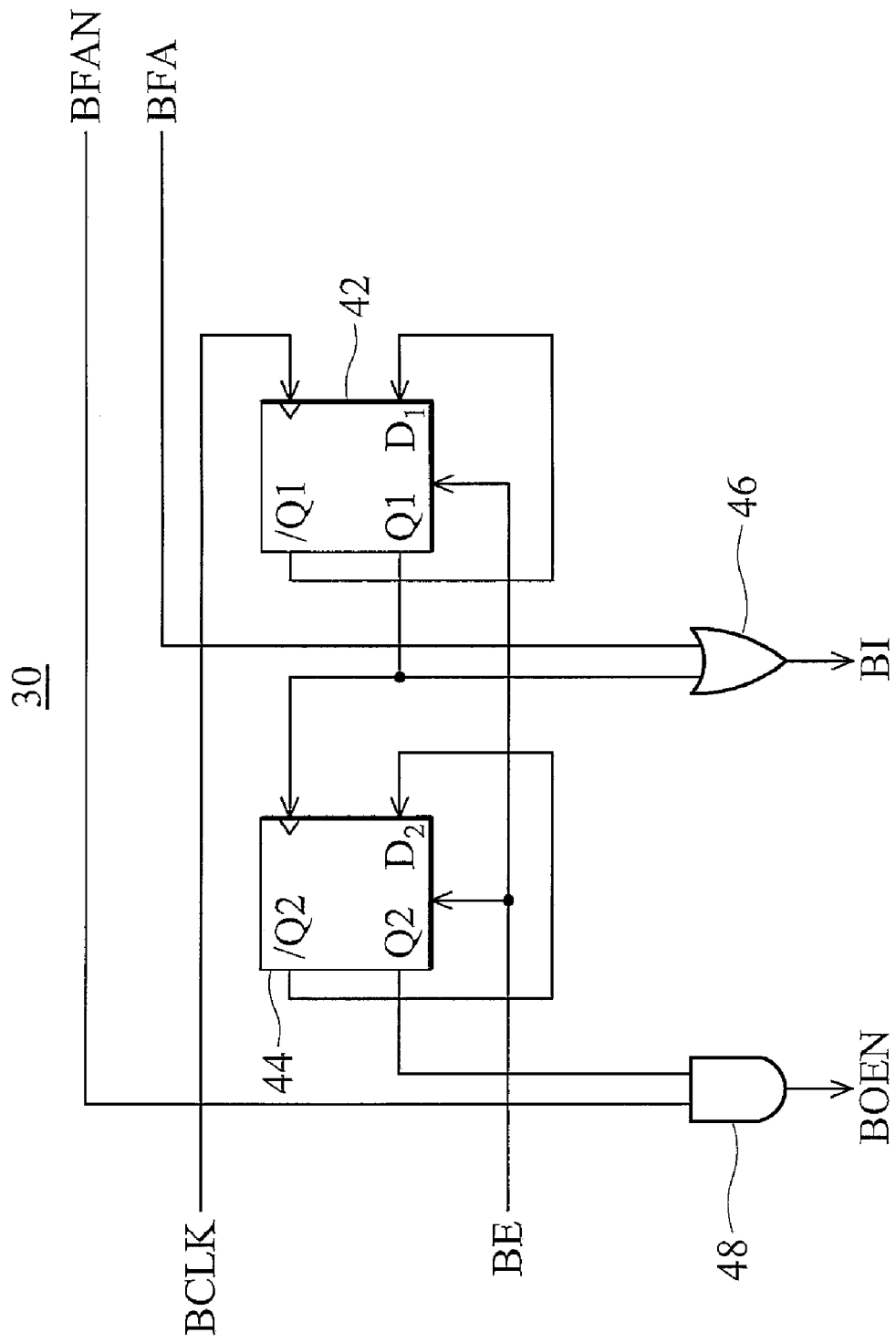
FIG. 4 shows a schematic diagram of an embodiment of a counter circuit.

FIG. 4 shows an embodiment of the counter circuit 30 that is a 2-bit counter circuit. The counter circuit 30 includes a first flip-flop circuit 42 and a second flip-flop circuit 44. The first flip-flop circuit 42 is clocked by BCLK and has its inverted output /Q1 fed back to its input D1. As a result, the non-inverted output Q1 repeatedly cycles between high and low levels. The second flip-flop circuit 44 is clocked by the non-inverted output Q1 from the first flip-flop 42. Thus, a clock cycle of the second flip-flop circuit 44 is twice as long as a clock cycle of the first flip-flop circuit 42. The second flip-flop circuit 44 has its inverted output /Q2 fed back to its input D2. As a result, the non-inverted output Q2 repeatedly cycles between high and low levels, but at half the pace of the first flip-flop circuit 42.

The counter circuit 30 also includes an OR gate 46 and an AND gate 48. The counter circuit 30 receives BIST fail signal BFA and its inverse BFAN from the register 32. If no failure has occurred, then BFA is low and BFAN is high. The OR gate 46 receives the non-inverted output Q1 of the first flip-flop circuit 42 and the BIST fail signal BFA. The AND gate 48 receives the non-inverted output Q2 of the second flip-flop circuit 44 and the inverted BIST fail signal BFAN.

Figure 5:
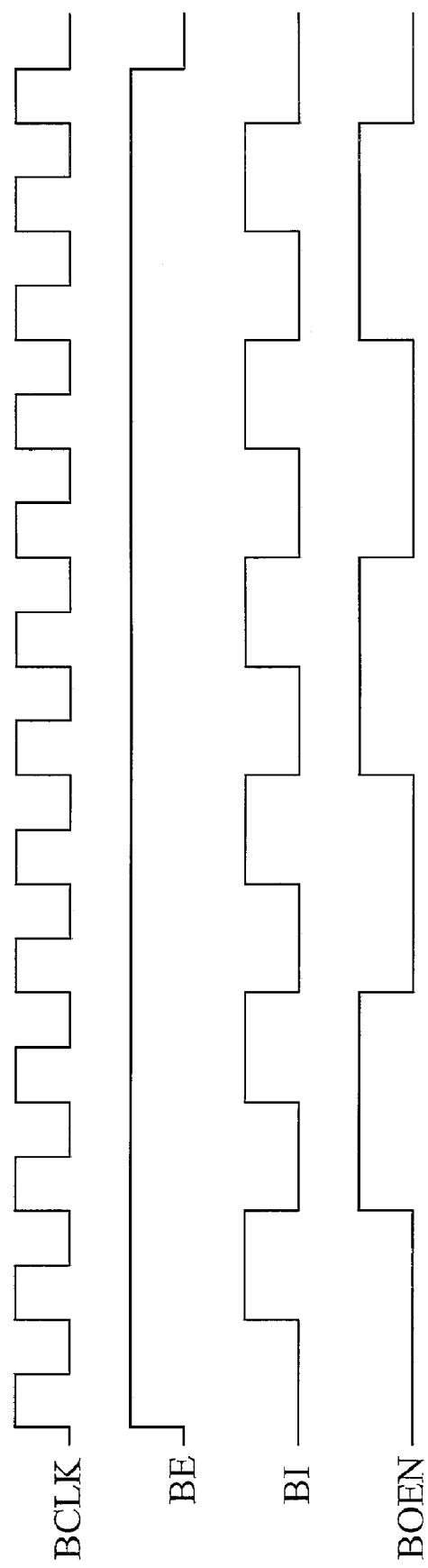
FIG. 5 shows a timing diagram of the counter circuit shown in FIG. 4; and (6)

FIG. 5 shows a timing chart of signals of the counter circuit 30 when no failure has been detected by the test logic 22. Note that if no failure has been detected by the test logic 22, the counter circuit 30 output (BI, BOEN) repeatedly cycles through (0,0), (1,0), (0,1), and (1,1).

If a failure has been detected by the test logic 22, then the BIST fail signal BFA is latched to a high level. As a result, the output BI of the OR gate 46 will be set to a constant high level. Otherwise, the output BI of the OR gate 46 cycles between high and low levels as the output Q1 of the first flip-flop circuit 42 cycles. With respect to the AND gate 48, a failure causes the inverted fail signal BFAN to latch low. As a result, the output of the AND gate 48 will also be latched low. Turning back to FIG. 3, when a failure has been detected by the test logic 22, the constant-low BOEN signal locks the I/O buffer 26 in output mode and the constant-high BI signal latches the output at the pad 28 to a high level. This allows detection of a failure at the pad 28.

Figure 6:
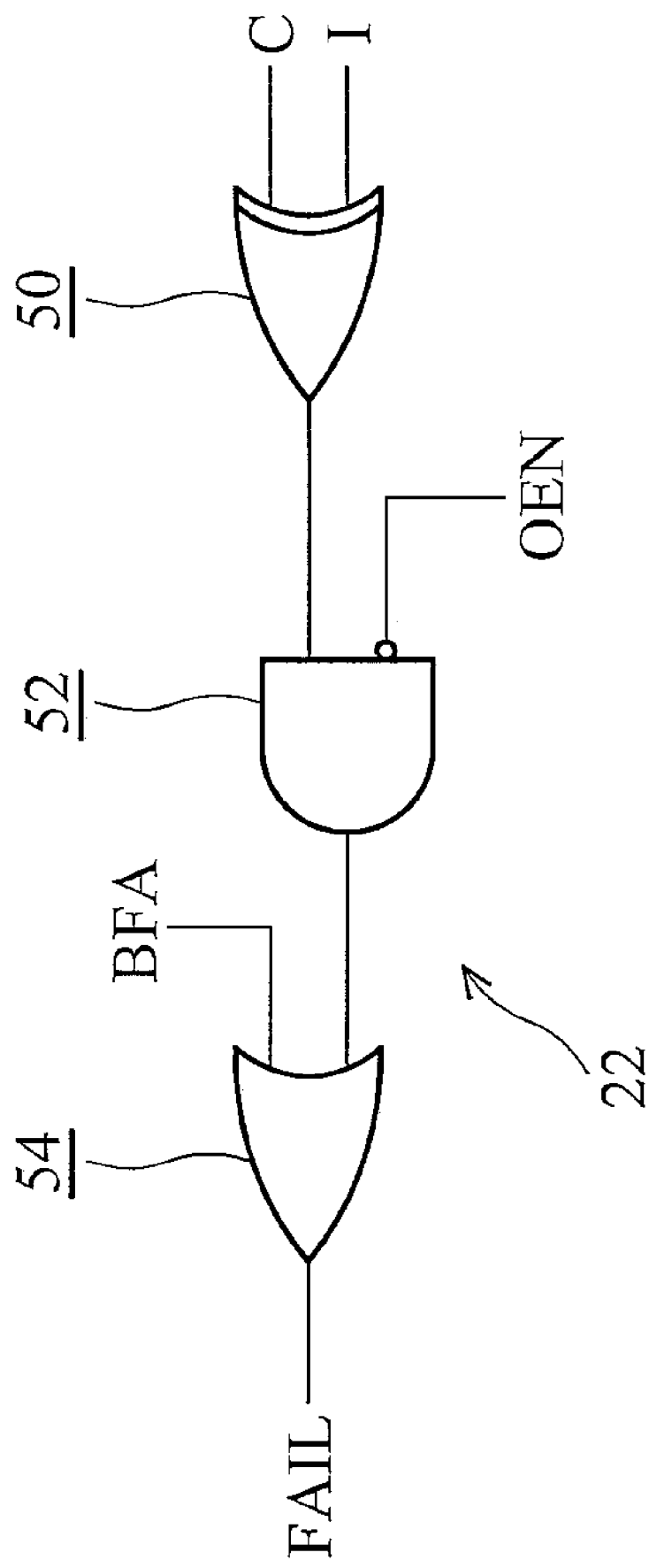
FIG. 6 shows a schematic diagram of an embodiment of a test logic circuit.

FIG. 6 shows an embodiment of the test logic 22. The test logic 22 compares the output of the I/O buffer 26 to the output of the counter circuit 30 in order to detect problems with the I/O cell 14. In this embodiment, the test logic 22 shown in FIG. 6 is a test logic circuit 22 that includes an XOR gate 50, an AND gate 52, and an OR gate 54. The test logic circuit 22 receives an input signal C from the input driver 38 of the I/O buffer 26 and an input signal I from the first multiplexer 34. The input signals C and I are passed to the XOR gate 50. The output of the XOR gate 50 is provided to the AND gate 52 along with an inverse of the signal OEN from the second multiplexer 36. The output of the AND gate 52 is provided to the OR gate 54 along with the BIST fail signal BFA, which is fed back from the buffer 32. Table 1 below shows a truth table for the logic circuit 22.

TABLE 1

| BFA | OEN | I | C | FAIL |
|-----|-----|---|---|------|
| 1   | x   | x | x | 1    |
| 0   | 1   | x | x | 0    |
| 0   | 0   | 0 | 0 | 0    |
| 0   | 0   | 0 | 1 | 1    |
| 0   | 0   | 1 | 0 | 1    |
| 0   | 0   | 1 | 1 | 0    |

As shown in Table 1, a failure is detected (FAIL=1) whenever C differs from I. In other words, a failure is detected if the data I inputted to the I/O buffer 26 does not match the data C subsequently sampled from the I/O buffer 26. Note that if BFA is high, this means that a failure was detected during a previous clock cycle so the FAIL flag is maintained.

While various embodiments in accordance with the principles disclosed herein have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. An integrated circuit device comprising:
a logic core;
an I/O cell comprising an I/O buffer and contact pad; and
a test circuit connected between the logic core and the I/O cell, the test circuit operable to (a) generate a simulation signal comprising test data; (b) provide the simulation signal to the I/O buffer; (c) retrieve data derived from the simulation signal from the I/O buffer; (d) determine whether the I/O cell has failed based on a comparison of the data retrieved from the I/O buffer to the test data provided to the I/O buffer; and (e) issue a fail signal at the contact pad indicative of whether the I/O cell has been determined to have failed.

2. The integrated circuit according to claim 1, wherein the test circuit comprises a pattern generator for generating the simulation signal.

3. The integrated circuit according to claim 2, wherein the simulation signal includes succession of different data values.

4. The integrated circuit according to claim 3, wherein the simulation signal includes repeated succession of all the possible data values generated by the logic core.

5. The integrated circuit according to claim 2, wherein the pattern generator includes a counter circuit.

6. The integrated circuit according to claim 1, wherein the test circuit comprises test logic for determining whether the I/O cell has failed.

7. The integrated circuit according to claim 6, wherein the test logic is operable to compare the data retrieved from the I/O cell to the data provided to the I/O cell.

8. The integrated circuit according to claim 7, wherein the test logic is operable to issue the fail signal indicative of whether the I/O cell has failed if the data retrieved from the I/O cell is different from the data provided to the I/O cell.

9. The integrated circuit according to claim 8, wherein the test circuit further comprises a register for storing the fail signal.

10. The integrated circuit according to claim 9, wherein, if the register is storing the fail signal, the test logic receives the fail signal from the register and reissues the fail signal.

11. The integrated circuit according to claim 1, wherein the test circuit further comprises a multiplexer circuit for controlling whether the I/O cell receives signals from the logic core or simulation signals from the test circuit.

12. A method of testing an I/O cell of an integrated circuit device and having an I/O buffer and a contact pad, the method comprising:
activating a pattern generator for generating a simulation signal comprising test data;
switching a signal path to cause the simulation signal to be provided to the I/O buffer;
storing the test data of the simulation signal in the I/O buffer;
retrieving data derived from the simulation signal from the I/O buffer;
comparing the test data of the simulation signal to the data retrieved from the I/O buffer;
determining whether the I/O cell has failed based on the results of the comparing of the test data of the simulation signal to the data retrieved from the I/O buffer; and
issuing a fail signal at the contact pad indicative of whether the I/O cell has failed.

13. The method according to claim 12, wherein the simulation signal includes repeated succession of all possible data values generated by a logic core.

14. The method according to claim 12, wherein the activating of the pattern generator include activating a counter circuit.

15. An integrated circuit device comprising:
a logic core;
first and second I/O cells, each comprising an I/O buffer and contact pad;
first and second test circuits configured to generate corresponding first and second simulation signal, each simulation signal comprising test data,
wherein the first test circuit is connected between the logic core and the first I/O cell, the first test circuit being operable to (a) store the test data of the first simulation signal in the first I/O buffer; (b) retrieve data derived from the first simulation signal from the I/O buffer of the first I/O cell; (c) perform a comparison of the data retrieved from the I/O buffer of the first I/O cell to the test data of the first simulation signal, and (d) issue a first fail signal indicative of the operability of the first I/O cell based on the comparison, and
wherein the second test circuit is connected between the logic core and the second I/O cell, the second test circuit being operable to (a) store the test data of the second simulation signal in the buffer of the second I/O cell; (b) retrieve data from the buffer of the second I/O cell; (c) perform a comparison of the data retrieved from the buffer of the second I/O cell to the test data of the second simulation signal, and (d) issue a second fail signal indicative of the operability of the second I/O cell based on the comparison; and
a fail detect circuit connected to the first and second test circuits for issuing a device failure signal at the pad of the first or second I/O cell if at least one of the corresponding first and second fail signals is issued.

16. The integrated circuit according to claim 15, wherein the first test circuit includes a first pattern generator for generating the first simulation signal.

17. The integrated circuit according to claim 16, wherein the second test circuit includes a second pattern generator for generating the second simulation signal.

18. The integrated circuit according to claim 15, wherein the first and second simulation signals each comprise a repeated succession of all the possible data values generated by the logic core.

* * * * *